(12) United States Patent
Hiroki

(10) Patent No.: US 11,437,259 B2
(45) Date of Patent: Sep. 6, 2022

(54) STAGE, STAGE MANUFACTURING METHOD, AND HEAT EXCHANGER

(71) Applicant: TOKYO ELECTRON LIMITED, Tokyo (JP)

(72) Inventor: Tsutomu Hiroki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 378 days.

(21) Appl. No.: 16/553,928

(22) Filed: Aug. 28, 2019

(65) Prior Publication Data

US 2019/0385881 A1 Dec. 19, 2019

Related U.S. Application Data

(62) Division of application No. 14/576,871, filed on Dec. 19, 2014, now Pat. No. 10,475,686.

(30) Foreign Application Priority Data

Dec. 24, 2013 (JP) ................................ 2013-265774
Nov. 11, 2014 (JP) ................................ 2014-228943

(51) Int. Cl.
    *H01L 21/683* (2006.01)
    *H01L 21/67* (2006.01)

(52) U.S. Cl.
    CPC .... *H01L 21/6831* (2013.01); *H01L 21/67109* (2013.01); *Y10T 29/49364* (2015.01)

(58) Field of Classification Search
    CPC ........... H01L 21/6831; H01L 21/67109; Y10T 29/49364; F28F 27/02; F28D 7/0066; F28D 7/12

USPC ...................................................... 29/890.03
See application file for complete search history.

(56) References Cited

U.S. PATENT DOCUMENTS

| | | | |
|---|---|---|---|
| 4,909,315 A | 3/1990 | Nelson et al. | |
| 5,085,750 A | 2/1992 | Soraoka et al. | |
| 5,228,502 A | 7/1993 | Chu et al. | |
| 5,239,443 A | 8/1993 | Fahey et al. | |
| 5,520,976 A | 5/1996 | Giannetti et al. | |
| 7,940,527 B2 | 5/2011 | Krause | |
| 8,953,335 B2 | 2/2015 | Abe et al. | |
| 2007/0074849 A1 | 4/2007 | Joshi et al. | |
| 2008/0037196 A1 | 2/2008 | Yonekura et al. | |
| 2009/0050294 A1 | 2/2009 | Fedorov | |
| 2009/0250195 A1 | 10/2009 | Yoshida et al. | |
| 2010/0132915 A1 | 6/2010 | Blanding | |
| 2012/0132397 A1 | 5/2012 | Silveira et al. | |

(Continued)

FOREIGN PATENT DOCUMENTS

| JP | 05-243191 A | | 9/1993 | |
|---|---|---|---|---|
| JP | 10284382 A | * | 10/1998 | ......... G03F 7/70875 |

(Continued)

*Primary Examiner* — Tho V Duong
*Assistant Examiner* — Raheena R Malik
(74) *Attorney, Agent, or Firm* — Nath, Goldberg & Meyer; Jerald L. Meyer; Tanya E. Harkins

(57) ABSTRACT

A stage includes a plate and a heat exchanger. The plate has a front surface, on which a substrate is mounted, and a rear surface. The heat exchanger is configured to individually supply a heat exchange medium to a plurality of two-dimensionally distributed and mutually non-inclusive regions of the rear surface of the plate and to recover the heat exchange medium thus supplied.

14 Claims, 17 Drawing Sheets

(56) References Cited

U.S. PATENT DOCUMENTS

2012/0247954 A1 10/2012 Yamawaku et al.
2013/0276981 A1 10/2013 Silveira et al.
2014/0054762 A1 2/2014 Nagaune
2014/0193977 A1 7/2014 Kawamata et al.

FOREIGN PATENT DOCUMENTS

| | | |
|---|---|---|
| JP | 10284382 A | 10/1998 |
| JP | 2000068249 A | 3/2000 |
| JP | 2001185492 A | 7/2001 |
| JP | 2003524885 A | 8/2003 |
| JP | 2004083338 A | 3/2004 |
| JP | 2005148578 A | 6/2005 |
| JP | 2007254827 A | 10/2007 |
| JP | 2009517144 A | 4/2009 |
| JP | 2011525052 A | 9/2011 |
| JP | 2013102169 A | 5/2013 |

* cited by examiner

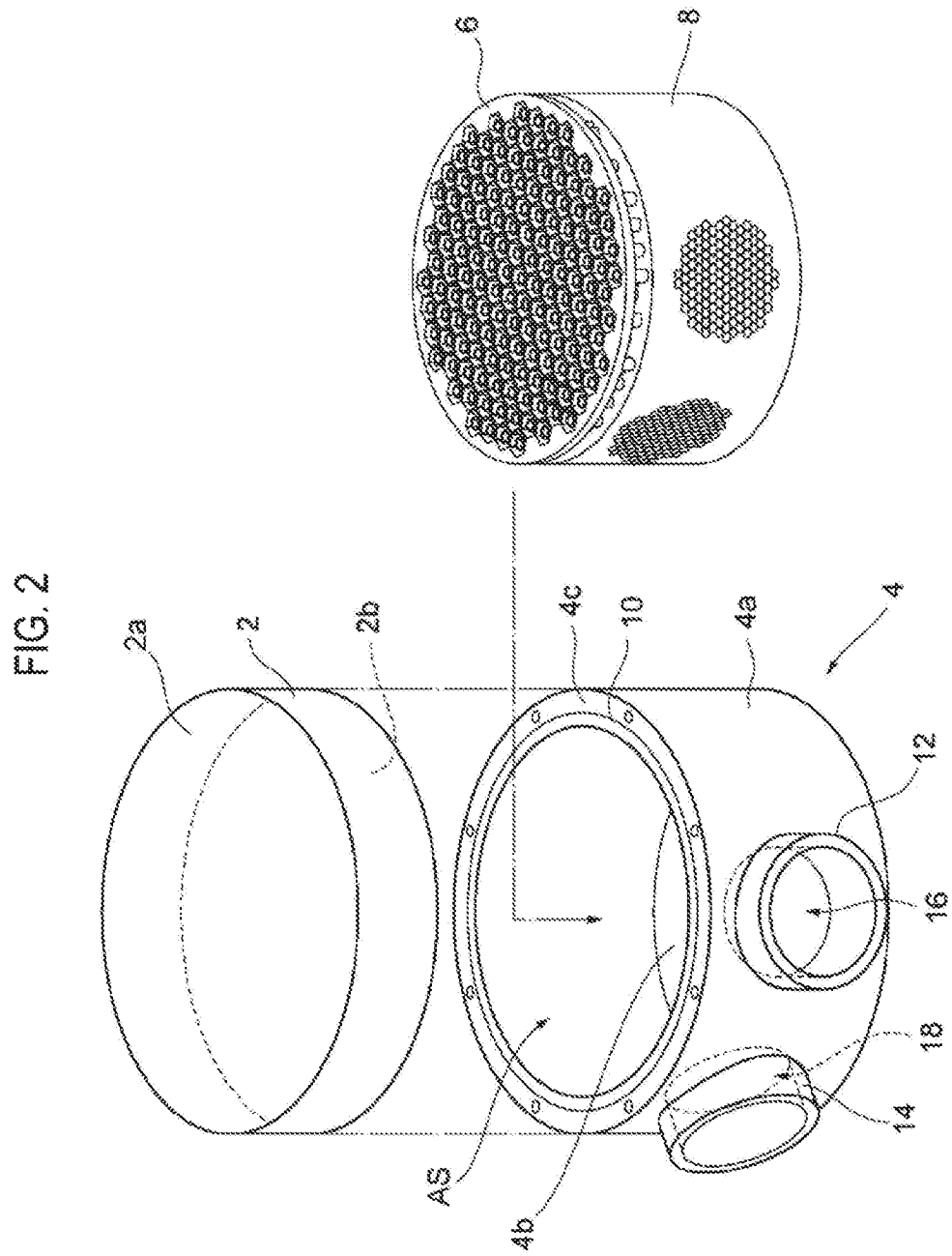

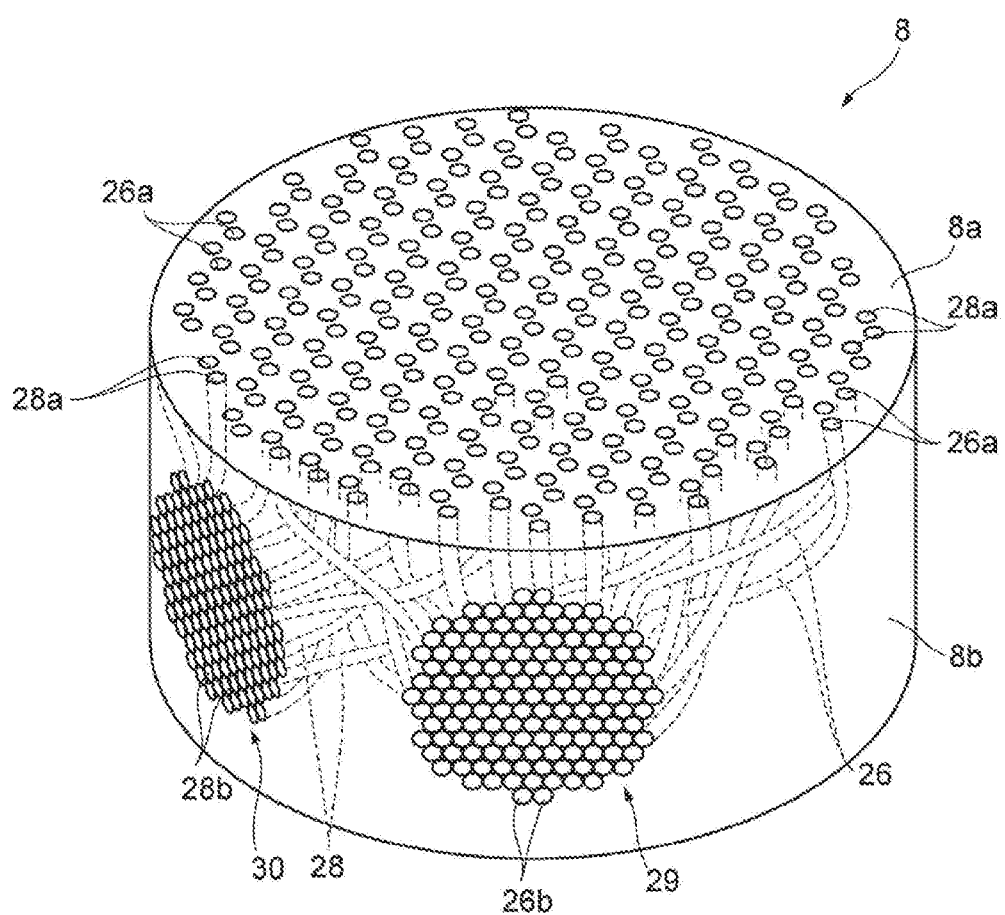

STAGE, STAGE MANUFACTURING METHOD, AND HEAT EXCHANGER

CROSS-REFERENCE TO RELATED APPLICATIONS

This is a Divisional Application of U.S. patent application Ser. No. 14/576,871, filed Dec. 19, 2014, an application claiming benefit of Japanese Patent Application Nos. 2013-265774, filed on Dec. 24, 2013, and 2014-228943, filed on Nov. 11, 2014, in the Japan Patent Office, the disclosure of which is incorporated herein in their entirety by reference.

TECHNICAL FIELD

The present disclosure relates to a stage, a stage manufacturing method, and a heat exchanger.

BACKGROUND

A semiconductor manufacturing apparatus includes a stage for supporting a substrate within a pressure-reducible process vessel. In general, the stage has a function of controlling the temperature of a substrate.

In the related art, the stage includes an electrode. Within the electrode, a plurality of flow paths which forms a concentric pattern when seen in a plan view is formed. In other words, each of the flow paths is installed to extend along a circumferential direction of the electrode. Each of the flow paths is connected to an independent coolant reservoir via first and second coolant supply paths. The coolant reservoir independently controls the temperature of a coolant and supplies a temperature-controlled coolant into the flow paths existing within the electrode via the first coolant supply path. The coolant supplied into the flow paths is circulated through the flow paths and is then returned to the coolant reservoir via the second coolant supply path. In other words, the coolant circulates through the coolant reservoir, the first coolant supply path and the second coolant supply path, thereby controlling the temperature of the substrate mounted on the stage.

In the stage of the related art, the coolant receives heat from the substrate while flowing through the flow paths extending in the circumferential direction of the electrode. For that reason, the temperature of the circulating coolants may vary depending on the position in the circumferential route. In the stage, it is therefore difficult to control the temperature distribution of the substrate to be uniform. However, along with the progress of miniaturization of semiconductor devices, an accurate temperature control is required in the related art.

SUMMARY

According to an embodiment of the present disclosure, a stage including a plate and a heat exchanger are provided. The plate has a front surface, on which a substrate is mounted, and a rear surface. The heat exchanger is configured to respectively supply a heat exchange medium to a plurality of two-dimensionally distributed and mutually non-inclusive regions of the rear surface of the plate and to recover the heat exchange medium thus supplied.

According to another embodiment of the present disclosure, a stage manufacturing method is provided. The method includes preparing a plate having a front surface, on which a substrate is mounted, and a rear surface; preparing a heat exchanger and a flow path unit either individually or simultaneously; and manufacturing a stage which includes the plate, the heat exchanger and the flow path unit. The heat exchanger includes: a plurality of first pipes extending upward toward the rear surface of the plate and providing open end portions which face the rear surface, the first pipes distributed below the plate; a partition wall configured to define a plurality of spaces respectively surrounding the first pipes; and a plurality of second pipes connected to the partition wall so as to communicate with the spaces respectively. The flow path unit is a block body including a plurality of first flow paths having first end portions respectively connected to the first pipes and second end portions, a plurality of second flow paths having first end portions respectively connected to the second pipes and second end portions, a first cluster portion in which the second end portions of the first flow paths are locally collected, and a second cluster portion in which the second end portions of the second flow paths are locally collected. At least the flow path unit may be formed using a 3D printer.

According to another embodiment of the present disclosure, there is provided a stage manufactured by the stage manufacturing method described above.

According to another embodiment of the present disclosure, a heat exchanger is provided. The heat exchanger includes a plurality of two-dimensionally distributed and mutually non-inclusive heat exchange units. The heat exchange units are configured to individually supply a heat exchange medium and to individually recover the heat exchange medium thus supplied.

According to another embodiment of the present disclosure, there is provided a substrate processing apparatus provided with the stage described above.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is an exploded perspective view schematically showing a stage according to one embodiment of the present disclosure.

FIG. 5 is a perspective view of a flow path unit.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Different embodiments will now be described in detail with reference to the drawings. Throughout the respective drawings, identical or equivalent parts will be designated by like reference symbols.

Figure 1:
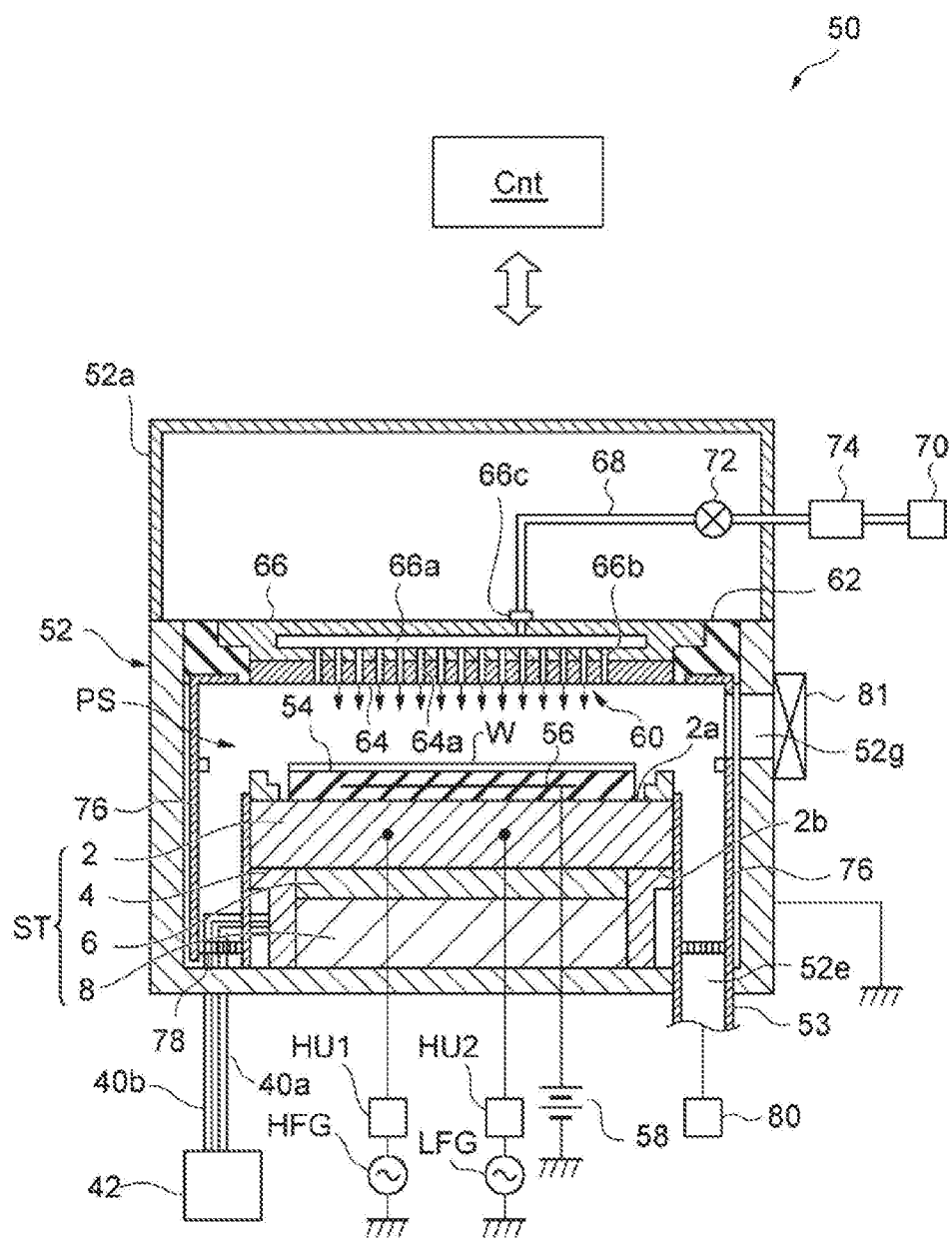
FIG. 1 is a sectional view schematically showing a plasma processing apparatus according to one embodiment of the present disclosure.

First of all, a description will be made on the plasma processing apparatus provided with a stage according to one embodiment of the present disclosure. FIG. 1 is a sectional view schematically showing a plasma processing apparatus 50 according to one embodiment of the present disclosure. The plasma processing apparatus 50 is a capacitively-coupled parallel plate type plasma etching apparatus. The plasma processing apparatus 50 includes a process vessel 52 having a substantially cylindrical shape. The process vessel 52 is made of, e.g., aluminum, and the surface of the process vessel 62 is subjected to an anodic oxidation treatment. The process vessel 52 is grounded.

A stage ST is disposed on the bottom portion of the process vessel 52. As shown in FIG. 1, the stage ST includes a plate 2, a case 4, a heat exchanger 6 and a flow path unit 8. The stage ST will be described in detail with reference to FIG. 2. FIG. 2 is an exploded perspective view of the stage ST. The stage ST shown in FIG. 2 is used as a mounting stand for supporting a substrate within the process vessel 52.

The plate 2 has a disc shape and is made of a metal, e.g., aluminum. The plate 2 includes a front surface 2a and a rear surface 2b. A substrate W may be mounted on the front surface 2a of the plate 2.

The case 4 is made of a metal, e.g., stainless steel. The case 4 includes a sidewall 4a and a bottom wall 4b. The sidewall 4a has a cylindrical shape and defines an accommodation space AS therein. The sidewall 4a extends along a cylinder axis direction and supports the plate 2 from below. The bottom wall 4b is connected to the lower end portion of the sidewall 4a. On an upper end surface 4c of the sidewall 4a, there may be installed an O-ring 10 which annularly extends along the upper end surface 4c. The plate 2 is air-tightly fixed to the upper end surface 4c through the O-ring 10 by virtue of, e.g., screws. Thus, the accommodation space AS is defined by the stage from above. A supply pipe 12 and a recovery pipe 14 are installed in the sidewall 4a. The supply pipe 12 extends along the radial direction of the sidewall 4a and communicates with the accommodation space AS via a first opening 16. The recovery pipe 14 extends along the radial direction of the sidewall 4a and communicates with the accommodation space AS via a second opening 18.

Figure 3A:
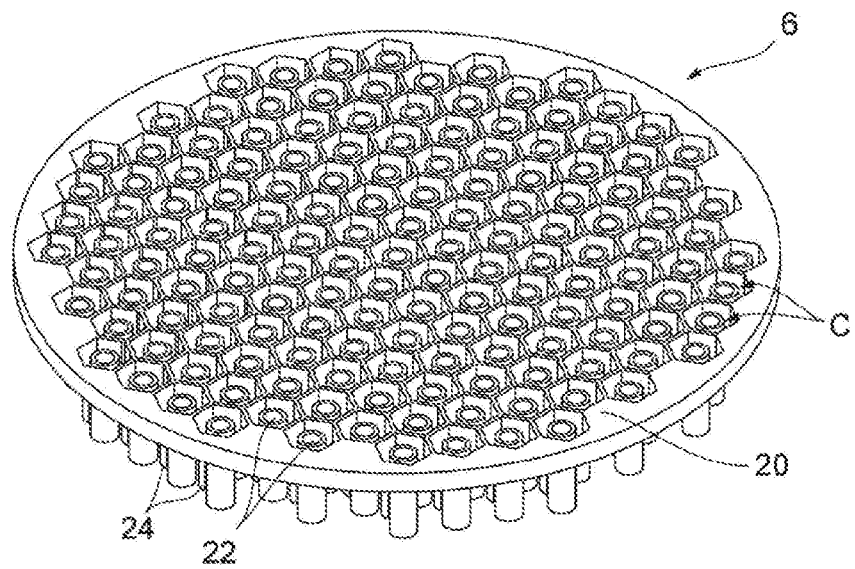
FIG. 3A is a top perspective view of a heat exchanger according to one embodiment of the present disclosure
Figure 3B:
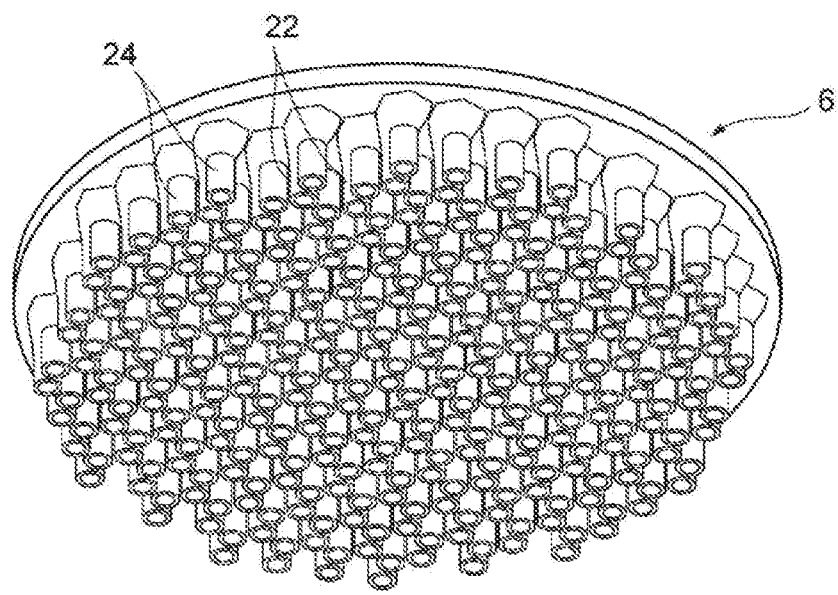
FIG. 3B is a bottom perspective view of the heat exchanger according to one embodiment of the present disclosure.

The heat exchanger 6 and the flow path unit 8 are accommodated within the accommodation space AS of the case 4. The heat exchanger 6 will be described in detail with reference to FIGS. 3A, 3B and 4A to 4C. FIG. 3A is a top perspective view of the heat exchanger 6 according to one embodiment, and FIG. 3B is a bottom perspective view of the heat exchanger 6 according to one embodiment. As shown in FIGS. 3A and 3B, the heat exchanger 6 includes a partition wall 20, a plurality of first pipes 22 and a plurality of second pipes 24. The heat exchanger 6 is configured to individually supply a heat exchange medium to a plurality of two-dimensionally distributed and mutually non-inclusive regions of the rear surface 2b of the plate 2 and to recover the heat exchange medium thus supplied.

Figure 4A:
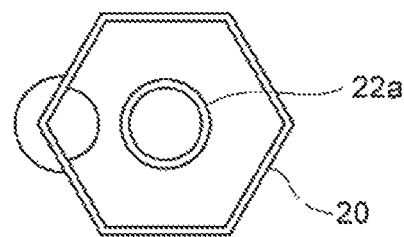
FIG. 4A is a plan view of one of cell portions
Figure 4B:
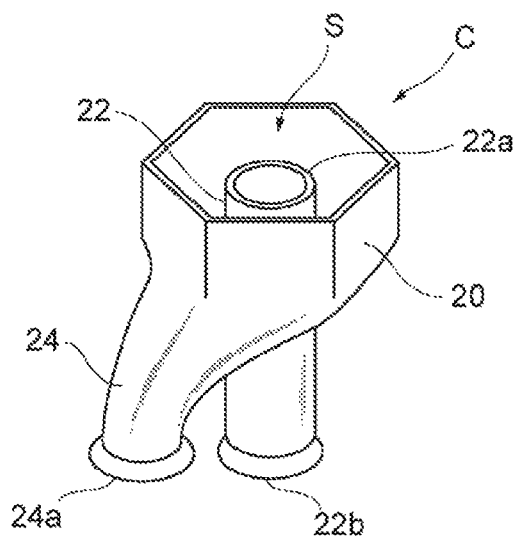
FIG. 4B is a top perspective view of one of the cell portions
Figure 4C:
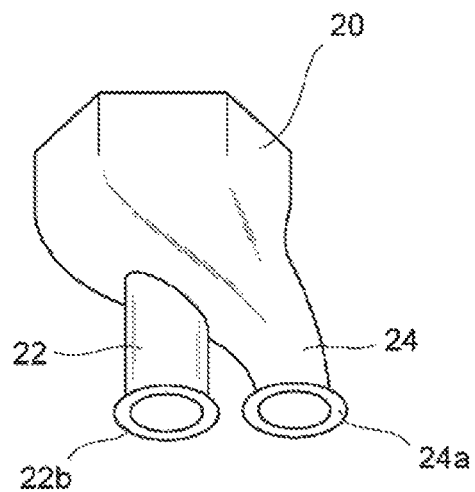
FIG. 4C is a bottom perspective view of one of the cell portions.

The partition wall 20 as a whole is formed into a disc shape or a circular columnar shape. The partition wall 20 includes a plurality of substantially hexagonal columnar cell portions C extending along a direction of a center axis of the partition wall 20. The cell portions C are coupled to each other so as to form a honeycomb structure when seen in a top plan view. The cell portions C define a plurality of spaces S having a hexagonal cross-sectional shape, respectively. In other words, the partition wall 20 forms a plurality of two-dimensionally distributed and mutually non-inclusive spaces S at the lower side of the plate 2. One of the cell portions C is shown in FIGS. 4A to 4C. FIG. 4A is a plan view of one of the cell portions C. FIG. 4B is a top perspective view of one of the cell portions C, and FIG. 4C is a bottom perspective view of one of the cell portions C.

Each of the first pipes 22 extends through a substantially central position of each of the spaces S corresponding thereto when seen in a plan view. The first pipes 22 extend toward the rear surface 2b of the plate 2 (see FIG. 2) in a substantially parallel relationship with one another. Each of the first pipes 22 is surrounded by the partition wall 20 which defines a space existing around each of the first pipes 22. Each of the first pipes 22 includes a first open end portion 22a and a second open end portion 22b. The first open end portion 22a is disposed so as to face the rear surface 2b of the plate 2. The second open end portion 22b is positioned at the opposite side from the first open end portion 22a and is located below the space S. The first pipes 22 serve as pipes which receive a heat exchange medium from a below-described chiller unit 42 and discharge the heat exchange medium through the first open end portion 22a.

The second pipes 24 are connected to the partition wall 20 so as to communicate with the spaces S, respectively. An opening 24a is formed in the lower end portion of each of the second pipes 24. The second pipes 24 serve as pipes which discharge, to the outside, the heat exchange medium discharged from the first open end portions 22a of the first pipes 22 and collected within the spaces S surrounding the first pipes 22. In the heat exchanger 6 described above, the first pipe 22, the partition wall 20 which defines the space S surrounding the first pipe 22, and the second pipe 24 which communicate with the space S, constitute the heat exchange unit. Thus, the heat exchanger 6 includes a plurality of mutually non-inclusive and two-dimensionally distributed heat exchange units.

In some embodiments, the heat exchanger 6 may be mainly made of a resin. The material of which the heat exchanger 6 is made may be partially changed in order to change the strength and the thermal conductivity of the heat exchanger 6. For example, the first open end portions 22a of the first pipes 22 may be made of a resin which contains carbon. This makes it possible to locally increase the strength of the first open end portions 22a. Furthermore, the heat exchanger 6 may be manufactured through the use of, e.g., a 3D printer.

Next, a description will be made on the flow path unit 8. FIG. 5 is a perspective view of the flow path unit 8. The flow path unit 8 is disposed below the heat exchanger 6. The flow path unit 8 provides flow paths for supplying a heat exchange medium to the heat exchanger 6 and flow paths for recovering the heat exchange medium from the heat exchanger 6.

As shown in FIG. 5, the flow path unit 8 is a block body having a substantially circular columnar shape. The flow path unit 8 includes a top surface 8a and a side surface 8b. The flow path unit 8 further includes a first cluster portion 29 and a second cluster portion 30, both of which protrude from the side surface 8b. In the flow path unit 8, there are formed a plurality of first flow paths 26 and a plurality of second flow paths 28 which extend through the flow path unit 8. In other words, a plurality of small-diameter cavities extending through the flow path unit 8 from the top surface 8a toward the first cluster portion 29 or the second cluster portion 30 are formed in the flow path unit 8. These cavities constitute the first flow paths 26 and the second flow paths 28. Each of the first flow paths 26 includes a first end portion 26a and a second end portion 26b. The first end portion 26a is formed on the top surface 8a of the flow path unit 8 in a corresponding positional relationship with each of the first pipes 22, and is connected to the second open end portion 22b of each of the first pipes 22. The second end portions 26b of the first flow paths 26 are locally collected in the first cluster portion 29. The first cluster portion 29 is formed in a corresponding positional relationship with the first opening 16 of the case 4. When accommodated within the case 4, the first cluster portion 29 faces the first opening 16.

Each of the second flow paths 28 includes a first end portion 28a and a second end portion 28b. The first end portion 28a of each of the second flow paths 28 is formed on the top surface 8a of the flow path unit 8 in a corresponding positional relationship with the opening 24a of each of the second pipes 24, and is connected to the opening 24a of each of the second pipes 24. The second end portions 28b of the second flow paths 28 are locally collected in the second cluster portion 30. The second cluster portion 30 is formed in a corresponding positional relationship with the second opening 18 of the case 4. When accommodated within the case 4, the second cluster portion 30 faces the second opening 18.

The first flow paths 26 and the second flow paths 28 are formed as independent flow paths which do not communicate with each other. In some embodiments, conductance for each of the first flow paths 26 is equal to each another. Conductance for each of second flow paths 28 is equal to each another. The term "conductance" used herein is an index which indicates the ease of flow of a fluid and is a value which is determined depending on the diameter, length and curvature of a flow path. For example, the diameter and curvature of the first flow paths 26 and the second flow paths 28 are adjusted depending on the length thereof. Thus, the first flow paths 26 and the second flow paths 28 become equal in conductance to one another. In some embodiments, the flow path unit 8 is mainly made of resin. By forming the first flow paths 26 and the second flow paths 28 in the block-shaped flow path unit 8 as mentioned above, it is possible to maximize the diameter of the first flow paths 26 and the second flow paths 28 and to increase the conductance of the first flow paths 26 and the second flow paths 28.

Referring back to FIG. 1, the plasma processing apparatus 50 will be described. An electrostatic chuck 54 is installed on the front surface 2a of the plate 2 of the stage ST. The electrostatic chuck 54 has a structure in which an electrode 56 as a conductive film is disposed between a pair of insulating layers or insulating sheets. A DC power source 58 is electrically connected to the electrode 56. The electrostatic chuck 54 can electrostatically suck and hold a substrate W using an electrostatic force, such as a Coulomb's force, which is generated by a DC voltage supplied from the DC power source 58.

First end portions of a first pipeline 40a and a second pipeline 40b are respectively connected to the supply pipe 12 and the recovery pipe 14 of the case 4 (see FIG. 2). Second end portions of the first pipeline 40a and the second pipeline 40b are connected to a chiller unit 42 installed outside the process vessel 52. A heat exchange medium having a predetermined temperature is circulatively supplied from the chiller unit 42 to the stage ST through the first pipeline 40a and the second pipeline 40b. The term "heat exchange medium" used herein refers to a fluid which circulates through the stage ST for the sake of heat exchange with the plate 2 and is a concept which encompasses a coolant that absorbs heat from the plate 2 and a heat medium that applies heat to the plate 2. As the heat exchange medium used as a coolant, it may be possible to use, e.g., the cooling water or a fluorine-based liquid. The heat exchange medium is not limited to a liquid. It may be possible to use phase-change cooling which makes use of vaporization heat or gas cooling which makes use of a gas.

The heat exchange medium supplied from the chiller unit 42 is returned to the chiller unit 42 through the first pipeline 40a, the supply pipe 12, the first flow paths 26, the first pipes 22, the second pipes 24, the second flow paths 28, the recovery pipe 14 and the second pipeline 40b. By controlling the temperature of the heat exchange medium to be circulated, it is possible to control the temperature of the substrate W mounted on the electrostatic chuck 54. In some embodiments, the chiller unit 42 may be individually connected to the first flow paths 26 through a plurality of mutually independent flow paths so as to independently control the temperatures of the heat exchange media supplied to the first flow paths 26. Similarly, the chiller unit 42 may be individually connected to the second flow paths 28 through a plurality of mutually independent flow paths. According to this embodiment, it is possible to individually control the temperatures of the heat exchange media discharged from a plurality of first pipelines 40a.

An upper electrode 60 is installed within the process vessel 52. The upper electrode 60 is disposed above the plate 2 serving as a lower electrode so as to face the plate 2. The plate 2 and the upper electrode 60 are installed substantially in parallel to each other. For example, a processing space PS for plasma-etching the substrate W is defined between the upper electrode 60 and the plate 2.

The upper electrode 60 is supported on the upper portion of the process vessel 52 through an insulation shielding member 62. The upper electrode 60 may include an electrode plate 64 and an electrode support body 66. The electrode plate 64 faces toward the processing space PS and defines a plurality of gas discharge holes 64a. The electrode plate 64 may be formed of a low-resistance conductor or semiconductor which is low in Joule heat. The electrode plate 64 is grounded.

The electrode support body 66 is configured to removably support the electrode plate 64 and may be made of a conductive material, e.g., aluminum. The electrode support body 66 may have a water-cooled structure. A gas diffusion chamber 66a is provided within the electrode support body 66. A plurality of gas flow holes 66b communicating with the gas discharge holes 64a extends downward from the gas diffusion chamber 66a. A gas introduction port 66c for guiding a process gas toward the gas diffusion chamber 66a is formed in the electrode support body 66. A gas supply pipe 68 is connected to the gas introduction port 66c.

A gas source 70 is connected to the gas supply pipe 68 through a valve 72 and a mass flow controller (MFC) 74. Instead of the MFC, an FCS may be installed. The gas source 70 is a supply source of a process gas. The process gas supplied from the gas source 70 is led to the gas diffusion chamber 66a through the gas supply pipe 68 and is discharged into the processing space PS through the gas flow holes 66b and the gas discharge holes 64a.

The plasma processing apparatus 50 may further include a grounded conductor 52a. The grounded conductor 52a is a grounded conductor having a substantially cylindrical shape and is installed so as to extend upward from the sidewall of the process vessel 52 beyond the height position of the upper electrode 60.

In the plasma processing apparatus 50, a deposit shield 76 is detachably attached to the inner wall of the process vessel 52. The deposit shield 76 is also installed on the outer periphery of the stage ST. The deposit shield 76 is configured to prevent an etching byproduct (deposit) from adhering to the process vessel 52, and may be configured by coating ceramic such as $Y_2O_3$ on an aluminum material.

At the bottom side of the process vessel 52, an exhaust plate 78 is installed between the stage ST and the inner wall of the process vessel 52. The exhaust plate 78 may be configured by, for example, coating ceramic such as $Y_2O_3$ on an aluminum material. At the lower side of the exhaust plate 78, an exhaust port 52e is formed in the process vessel 52. An exhaust device 80 is connected to the exhaust port 52e through an exhaust pipe 53. The exhaust device 80 includes a vacuum pump such as a turbo molecular pump. The exhaust device 80 can reduce the internal pressure of the process vessel 52 to a desired vacuum level. A carry-in/carry-out gate 52g for carrying the substrate W into or out of the process vessel 52 is installed in the sidewall of the process vessel 52. The carry-in/carry-out gate 52g can be opened and closed by a gate valve 81.

In some embodiments, the plasma processing apparatus 50 further includes a high-frequency power source HFG, a high-frequency power source LFG, a matcher HU1 and a matcher HU2. The high-frequency power source HFG generates high-frequency power for the generation of plasma and supplies high-frequency power having a frequency of 27 MHz or more, e.g., 40 MHz, to the plate 2 through the matcher HU1. The matcher HU1 includes a circuit configured to match the internal (or output) impedance of the high-frequency power source HFG with the load impedance. Furthermore, the high-frequency power source LFG generates high-frequency bias power for implementing ions to the plate 2 and supplies high-frequency bias power having a frequency of 13.56 MHz or less, e.g., 3 MHz, to the plate 2 through the matcher HU2. The matcher HU2 includes a circuit configured to match the internal (or output) impedance of the high-frequency power source LFG with the load impedance. A lower electrode may be installed independently of the plate 2.

In some embodiments, the plasma processing apparatus 50 may further include a control unit Cnt. The control unit Cnt is a computer which includes a processor, a memory unit, an input unit, a display unit, and so forth. The control unit Cnt controls the respective parts or units of the plasma processing apparatus 50, for example, a power supply system, a gas supply system, a drive system, and so forth. In the control unit Cnt, an operator can perform an input operation of a command for managing the plasma processing apparatus 50 through the use of the input unit. Furthermore, in the control unit Cnt, the operating situation of the plasma processing apparatus 50 may be displayed visually through the use of the display unit. The memory unit of the control unit Cnt stores a control program for enabling the processor to control various kinds of processes implemented in the plasma processing apparatus 50 and a program, i.e., a process recipe, for enabling the respective components of the plasma processing apparatus 50 to implement processes according to process conditions.

Figure 6:
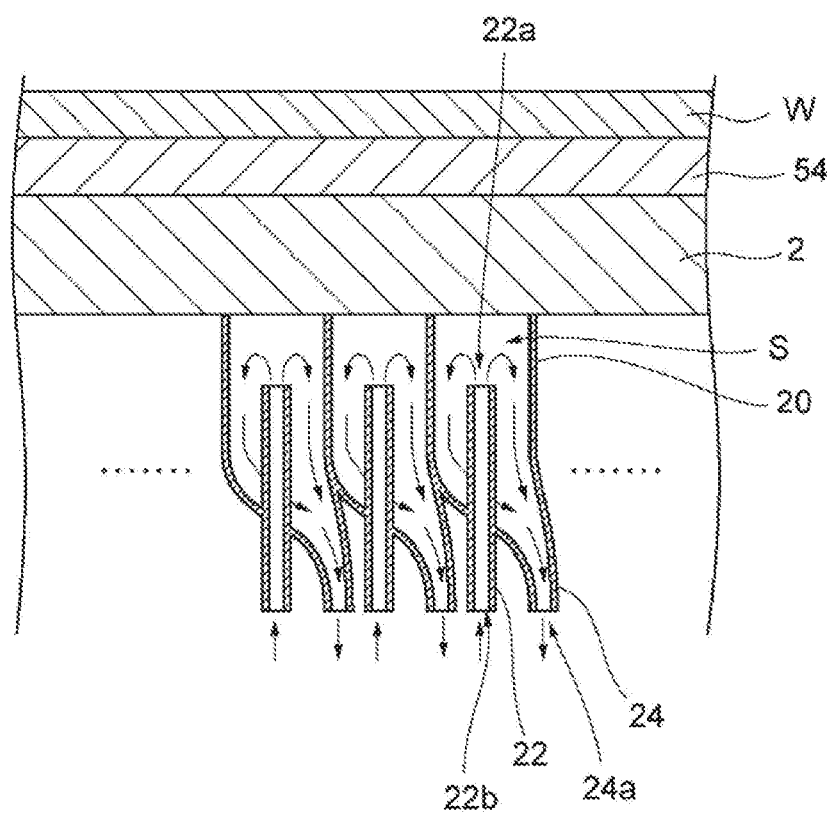
FIG. 6 is a sectional view schematically showing the flow of a heat exchange medium within the heat exchanger.

Next, a description will be made on the flow of the heat exchange medium within the stage ST. FIG. 6 is a sectional view schematically showing the flow of the heat exchange medium within the heat exchanger 6.

The heat exchange medium supplied from the first opening 16 into the stage ST by the chiller unit 42 flows through the first flow paths 26 of the flow path unit 8 and flows into the first pipes 22 through the second open end portions 22b. The heat exchange medium flowing into the first pipes 22 from the second open end portions 22b is moved upward along the first pipes 22 and is discharged from the first open end portions 22a toward the rear surface 2b of the plate 2. The heat exchange medium discharged from the first open end portions 22a makes contact with the rear surface 2b of the plate 2 which faces the first open end portions 22a, thereby performing heat exchange with the plate 2. The heat exchange medium which has performed the heat exchange is moved downward along the partition wall 20 and is discharged to the outside of the spaces S from the openings 24a of the second pipes 24. The heat exchange medium discharged from the spaces S is returned to the chiller unit 42 through the second flow paths 28, which are connected to the openings 24a, and the second opening 18.

As described above, the heat exchanger 6 is configured such that the heat exchange medium is individually discharged from the first pipes 22 two-dimensionally disposed so as to extend in parallel to one another and such that the discharged heat exchange medium is recovered by the second pipes 24 through the corresponding spaces S. In other words, the heat exchanger 6 is provided with a plurality of heat exchange units. The heat exchange units provide heat exchange medium flow paths which are independent of each other. According to the heat exchanger 6 described above, the heat exchange medium is individually discharged from the first open end portions 22a facing the rear surface 2b of the plate 2 toward the rear surface 2b. It is therefore possible to suppress variation in the temperature of the heat exchange media circulating through the spaces S.

Figure 7:
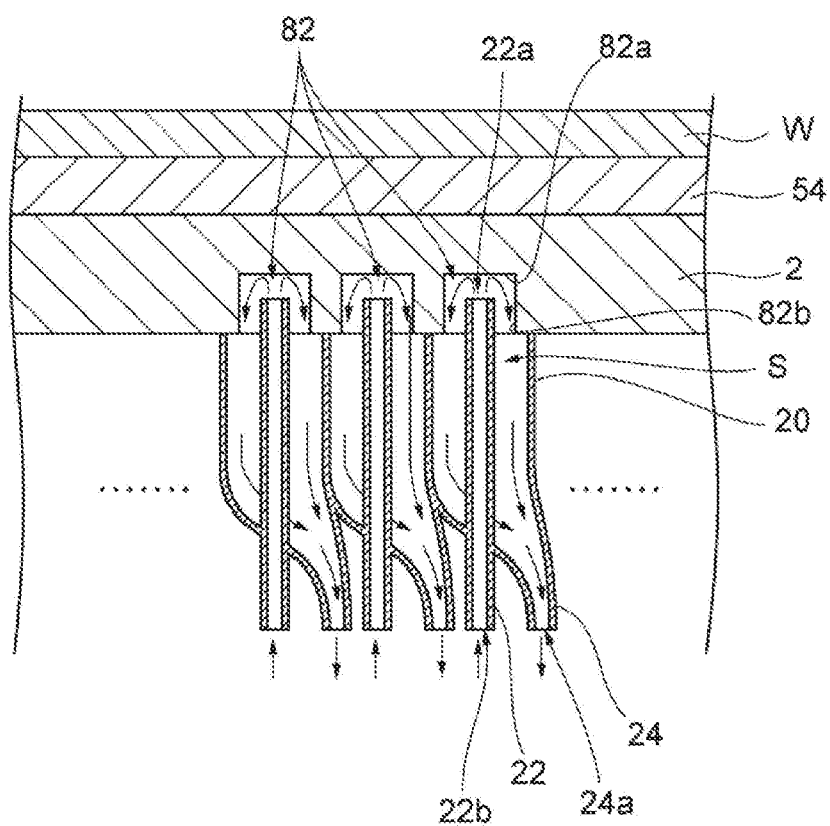
FIG. 7 is a sectional view schematically showing the flow of the heat exchange medium within the heat exchanger.

In some embodiments, as shown in FIG. 7, a plurality of recess portions 82 extending toward the front surface 2a may be formed on the rear surface 2b of the plate 2 which defines the spaces S. The first open end portions 22a may be respectively inserted into the recess portions 82. Each of the recess portions 82 includes an upper wall surface 82a which defines each of the recess portions 82 at the upper side thereof and a sidewall surface 82b which defines each of the recess portions 82 at the lateral side thereof. The horizontal cross-sectional shape of each of the recess portions 82 may be a circular shape. In the embodiment shown in FIG. 7, the upper wall surface 82a and the sidewall surface 82b of each of the recess portions 82 become contact surfaces which make contact with the heat exchange medium. Thus, the heat exchange area is increased. Further, the heat exchange position can be caused to come close to the front surface 2a which exists near a heat generation source. Accordingly, in this embodiment, the heat exchange efficiency is improved.

Figure 8:
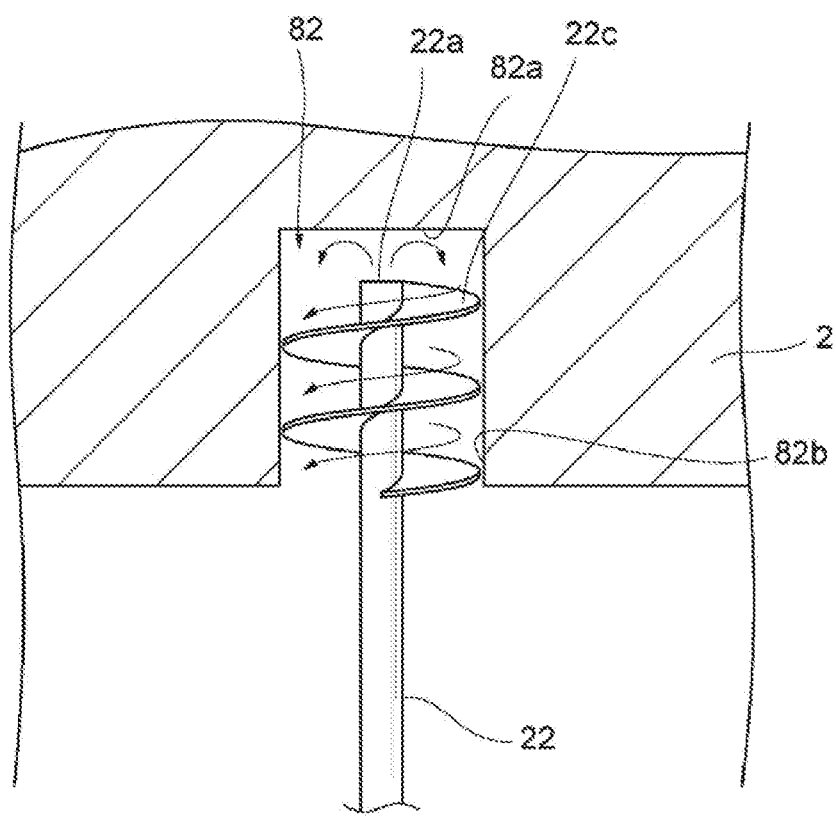
FIG. 8 is a sectional view schematically showing the flow of the heat exchange medium within the heat exchanger.

In another embodiment, as shown in FIG. 8, a spirally-extending slope 22c may be formed on the outer circumferential surface of each of the first pipes 22. The slope 22c spirally guides the heat exchange medium discharged from the first open end portion 22a so as to flow along the sidewall surface 82b of each of the recess portions 82. According to the embodiment shown in FIG. 8, it is possible for the slope 22c to further increase the contact area between the plate 2 and the heat exchange medium. Thus, the heat exchange efficiency is further improved.

Figure 9:
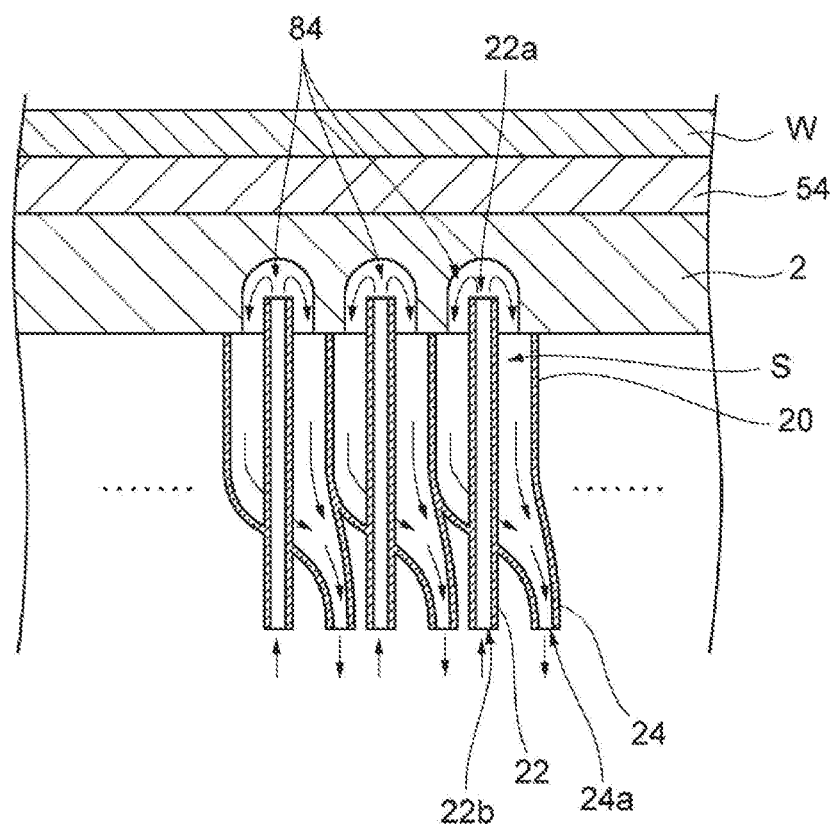
FIG. 9 is a sectional view schematically showing the flow of the heat exchange medium within the heat exchanger.

In another embodiment, as shown in FIG. 9, a plurality of recess portions 84 each defined by a gently curved surface may be formed on the rear surface 2b of the plate 2. The first open end portions 22a may be respectively inserted into the recess portions 84. In the embodiment shown in FIG. 9, the heat exchange medium discharged from each of the first open end portions 22a is moved along the gently curved surface. It is therefore possible to prevent generation of an air pocket within each of the recess portions 84, which may otherwise reduce the heat exchange efficiency.

Figure 10:
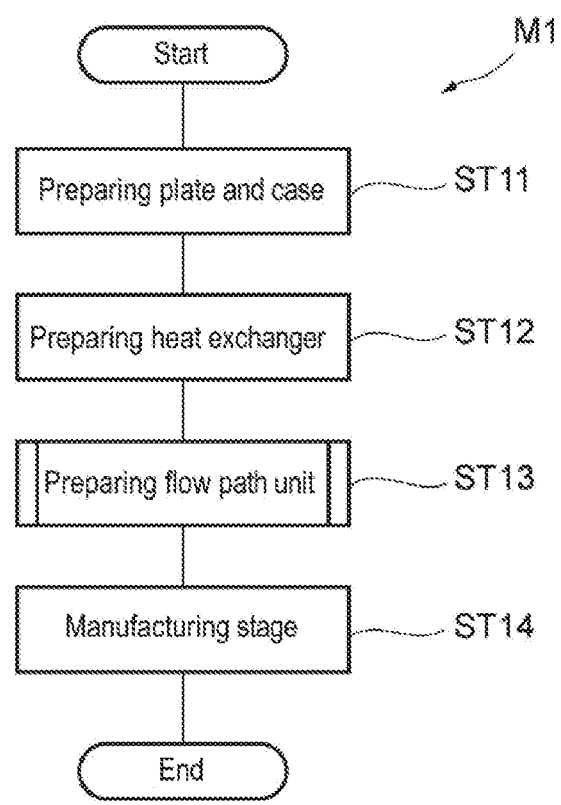
FIG. 10 is a flowchart illustrating a stage manufacturing method according to one embodiment of the present disclosure.

Next, a description will be made on a manufacturing method of the stage ST. FIG. 10 is a flowchart illustrating a manufacturing method M1 of the stage ST according to one embodiment. In the manufacturing method M1, at Step ST11, the plate 2 and the case 4 are prepared. Subsequently, at Step ST12, the heat exchanger 6 is prepared. In some embodiments, the heat exchanger 6 is formed by a 3D printer. A model data of the heat exchanger 6 read by the 3D printer is prepared using, e.g., three-dimensional CAD software.

Figure 11:
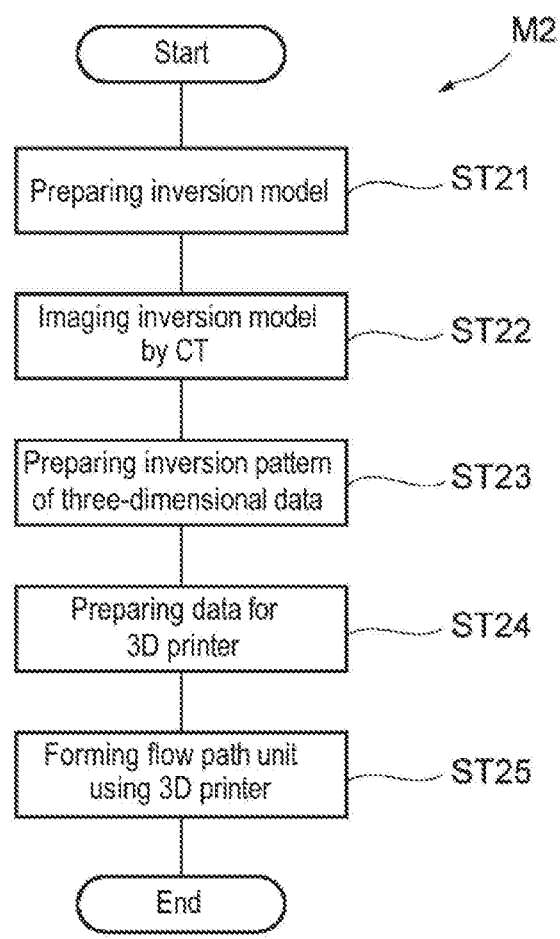
FIG. 11 is a flowchart illustrating a flow path unit forming method.
Figure 12:
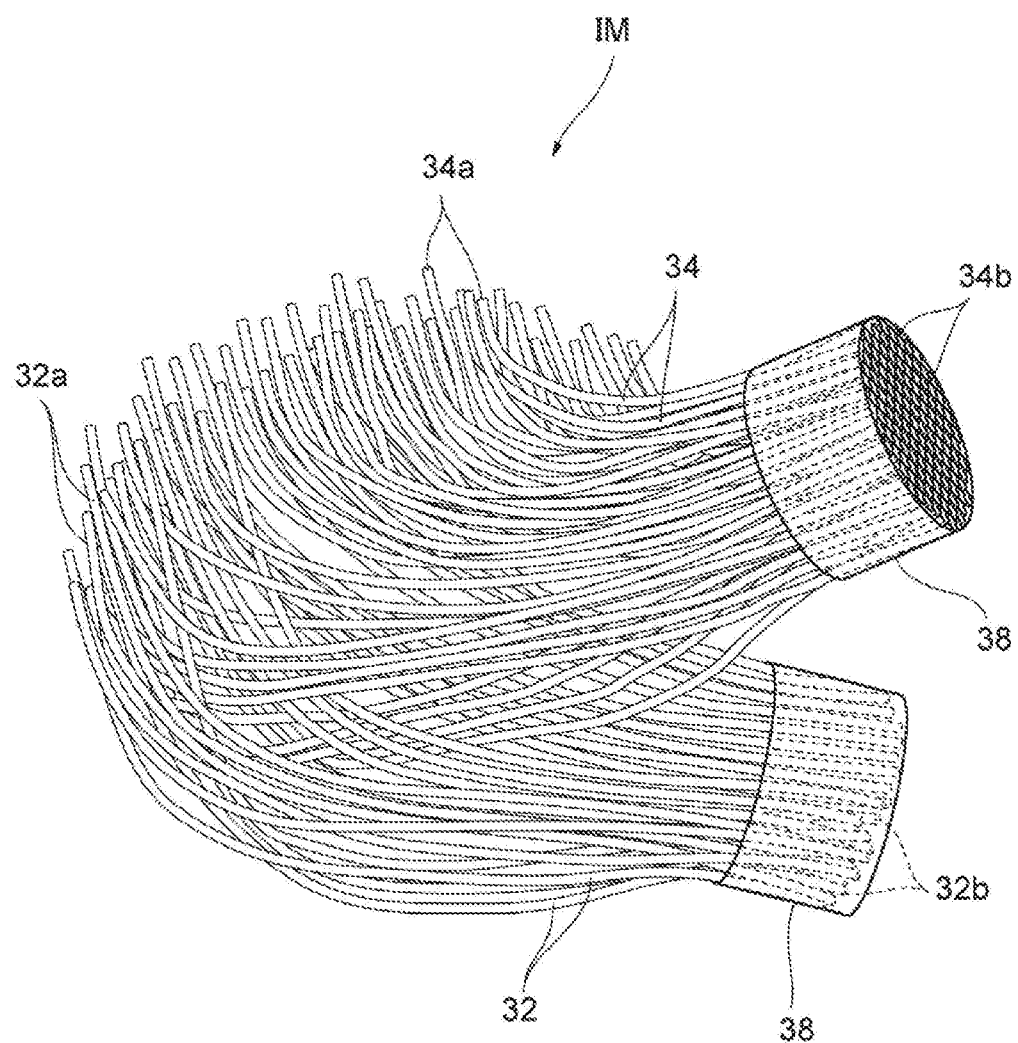
FIG. 12 is a perspective view showing the shape of an inversion model.

Subsequently, at Step ST13, the flow path unit 8 is prepared. A forming method of the flow path unit 8 will be described in detail with reference to FIG. 11. FIG. 11 is a flowchart illustrating a forming method M2 of the flow path unit 8. In the forming method M2, at Step ST21, an inversion model IM having an inverted shape of the first flow paths 26 and the second flow paths 28 is first prepared. FIG. 12 is a perspective view showing one example of the inversion model IM. The inversion model IM includes a plurality of first solid cables 32 having an inverted shape of the first flow paths 26 and a plurality of second solid cables 34 having an inverted shape of the second flow paths 28. The first solid cables 32 and the second solid cables 34 are made of, e.g., a synthetic rubber, and have a solid structure. First end portions 32a and second end portions 32b of the first solid cables 32 are fixed at the positions corresponding to the positions of the first end portions 26a and the second end portions 26b of the first flow paths 26, respectively. Moreover, first end portions 34a and second end portions 34b of the second solid cables 34 are fixed at the positions corresponding to the positions of the first end portions 28a and the second end portions 28b of the second flow paths 28, respectively.

Figure 13:
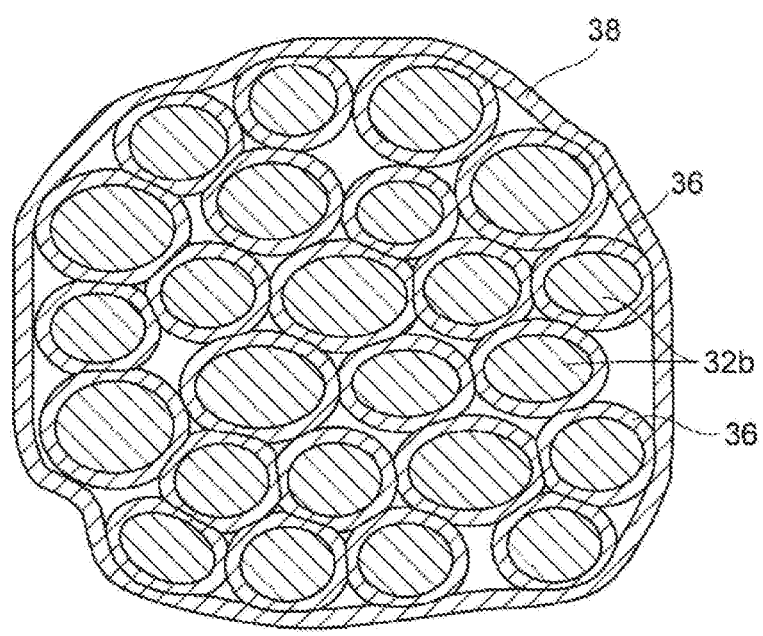
FIG. 13 is a sectional view showing radial cross sections of second end portions of first solid cables.

FIG. 13 shows the radial cross sections of the second end portions 32b of the first solid cables 32. The second end portions 34b of the second solid cables 34 have the same configuration as the configuration of the second end portions 32b of the first solid cables 32. Therefore, only the configuration of the second end portions 32b of the first solid cables 32 will be described herein below. As shown in FIG. 13, the outer circumferences of the second end portions 32b are respectively covered with a plurality of isolating tubes 36. The isolating tubes 36 are used to keep the first solid cables 32 from contacting each other and may be made of a material, such as polyolefin, which differs from the material of the first solid cables 32 and the second solid cables 34. The second end portions 32b of the first solid cables 32 and the second end portions 34b of the second solid cables 34 are respectively bundled by a bundling tube 38. The bundling tube 38 may be made of the same material as the material of the isolating tubes 36. The second end portions 32b of the first solid cables 32 and the second end portions 34b of the second solid cables 34 bundled in this way are respectively disposed at the positions corresponding to the positions of the first opening 16 and the second opening 18 of the case 4.

Subsequently, at Step ST22, the inversion model IM is imaged by computer tomography (CT-imaged). A three-dimensional data including a cross-sectional structure of the inversion model IM is prepared from the CT image thus taken. At this time, a three-dimensional data for only the portions of the inversion model IM corresponding to the first solid cables 32 and the second solid cables 34 is prepared using the difference between the material of the first solid cables 32 and the second solid cables 34 and the material of the isolating tubes 36 and the bundling tube 38, specifically the difference between the X-ray transmittances.

Thereafter, at Step ST23, a three-dimensional data of an inversion pattern of the three-dimensional data prepared at Step ST22 is generated. Since the inversion model IM has an inverted shape of the first flow paths 26 and the second flow paths 28, the inversion pattern of the three-dimensional data of the inversion model IM generated at Step ST23 is a three-dimensional data of the three-dimensional structure including the first flow paths 26 and the second flow paths 28. The generation of the inversion pattern is performed using, e.g., image processing software.

Subsequently, at Step ST24, the inversion pattern of the three-dimensional data of the inversion model IM is converted to a model data suitable for the data format of the 3D printer. The model data suitable for the data format of the 3D printer refers to a three-dimensional data which indicates a three-dimensional structure in. e.g., an STL (Standard Triangulated Language) format. In some embodiments, at this time, the diameter, curvature and length of the portions of the model data for each of the first flow paths 26 and the second flow paths 28 may be finely adjusted such that the conductance of the first flow paths 26 and the second flow paths 28 becomes uniform. The conductance can be easily adjusted by adjusting the diameter of the flow paths which heavily affect the conductance.

Then, at Step ST25, the flow path unit 8 is formed by causing the 3D printer to read the model data. The heat exchanger 6 and the flow path unit 8 may be individually formed using the 3D printer or may be simultaneously formed by combining the model data of the heat exchanger 6 and the model data of the flow path unit 8.

Referring back to FIG. 10, at Step ST14 of the method M1, the stage ST including the plate 2, the case 4, the heat exchanger 6 and the flow path unit 8 thus prepared is manufactured. In other words, the heat exchanger 6 and the flow path unit 8 are coupled to each other such that the second open end portions 22b of the first pipes 22 are connected to the first end portions 26a of the first flow paths 26 and such that the openings 24a of the second pipes 24 are connected to the first end portions 28a of the second flow paths 28. The heat exchanger 6 and the flow path unit 8 are accommodated within the case 4 such that the first cluster portion 29 and the second cluster portion 30 face the first opening 16 and the second opening 18 respectively. By disposing the plate 2 on the case 4, the accommodation space AS is defined by the plate 2 and the case 4.

Figure 14:
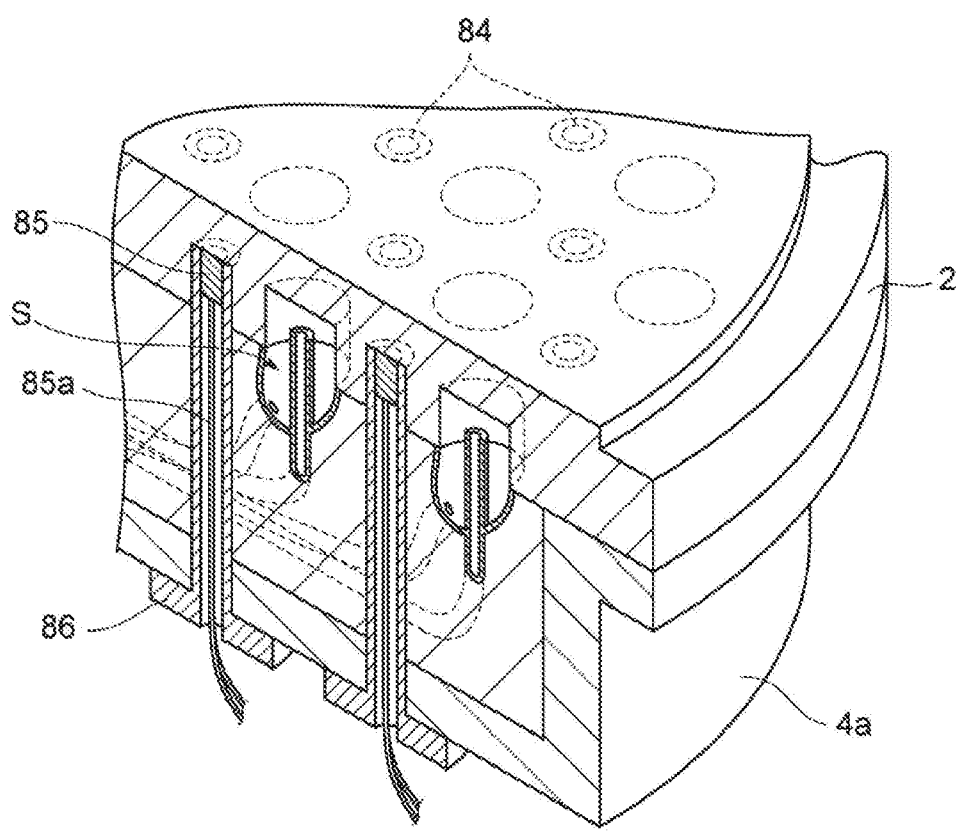
FIG. 14 is a sectional perspective view schematically showing a stage according to one embodiment of the present disclosure.

In some embodiments, as shown in FIG. 14, a plurality of heaters 85 disposed so as to be distributed in a two-dimensional pattern within the plate 2 of the stage ST may be further installed. The heaters 85 are respectively connected to a plurality of heater power sources through cables 85a. The heaters 85 can wholly or partially heat the plate 2 by generating heat with the electric power supplied from the heater power sources. The heaters 85 and the cables 85a are accommodated within isolation tubes 86 which extend into the plate 2 through the bottom wall 4b of the case 4 so as to avoid the first flow paths 26, the second flow paths 28 and the spaces S. The upper end portions of the isolation tubes 86 are opened. The heaters 85 make contact with the plate 2 through the upper end portions of the isolation tubes 86. The isolation tubes 86 may be made of a material having a high thermal insulation property such that the heat of the heaters 85 should not be transferred to the heat exchanger 6 or the flow path unit 8. In some embodiments, a thread may be formed in the tip portion of each of the heaters 85. The threaded tip portion may be used as a bolt for fixing the plate 2 and the case 4 together.

Figure 15:
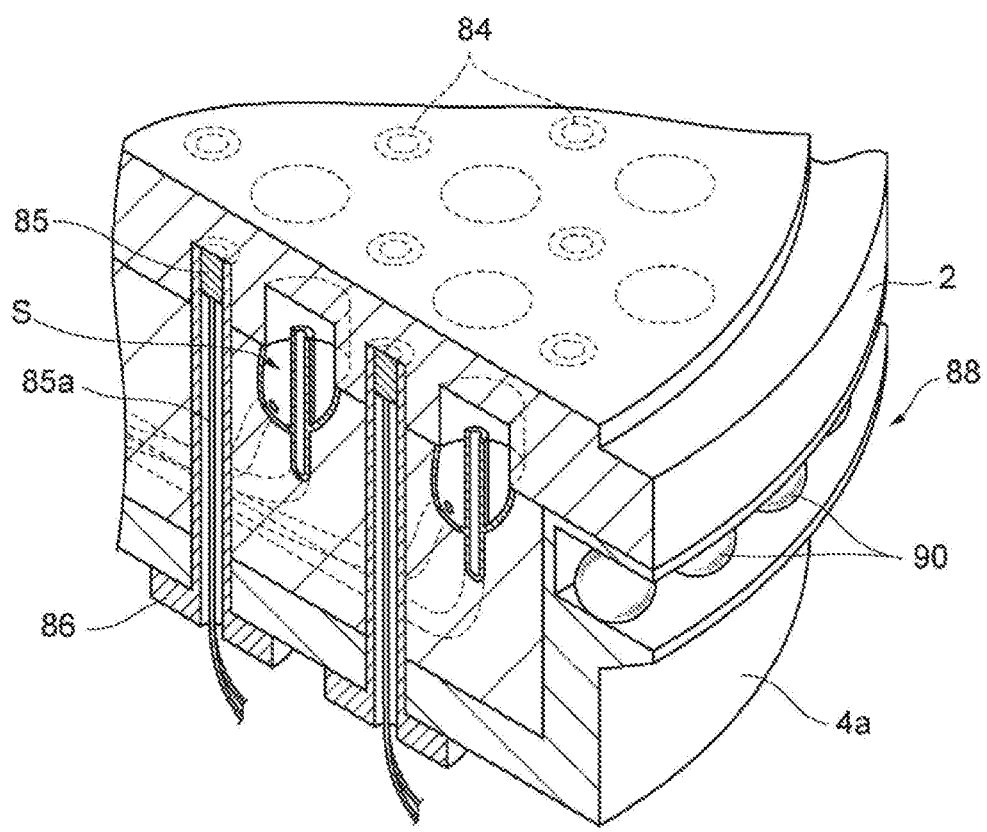
FIG. 15 is a sectional perspective view schematically showing the stage according to one embodiment of the present disclosure.

In some embodiments, as shown in FIG. 15, a stepped portion 88 may be formed in the sidewall 4a of the case 4 by reducing the diameter of a portion of the outer circumferential surface of the sidewall 4a. The stepped portion 88 is formed to extend along the circumferential direction of the sidewall 4a. In the sidewall 4a, a plurality of balls 90 is disposed along the stepped portion 88. The balls 90 have a diameter substantially equal to the height-direction width of the stepped portion 88 and support the weight of the plate 2 together with the sidewall 4a. The balls 90 may be made of a heat insulating material. Since the balls 90 make point-to-point contact with the sidewall 4a, it is possible to keep the thermal conductivity very low. Accordingly, in the embodiment shown in FIG. 15, the stepped portion 88 can cut off the heat of the plate 2 heated by the heaters 85 or the substrate W. This makes it possible to suppress the transfer of the heat of the plate 2 to the heat exchanger 6 and the flow path unit 8 through the case 4.

Figure 16:
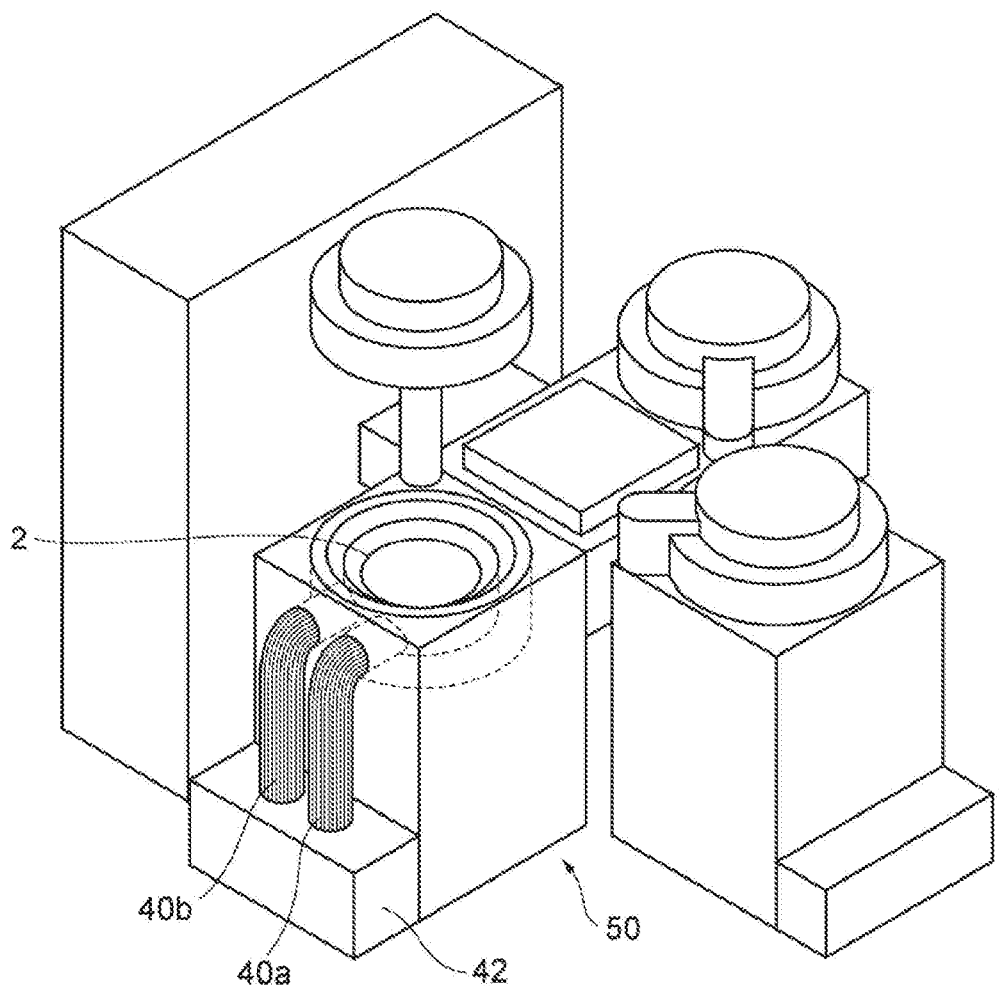
FIG. 16 is a perspective view schematically showing a semiconductor manufacturing system.

FIG. 16 is a perspective view schematically showing a semiconductor manufacturing system which includes the plasma processing apparatus 50 described above. In the related art, a heat exchange medium is circulated through a flow path extending along a circumferential direction of a plate. Therefore, there is a need for a chiller unit which includes a pump having a high discharge pressure. For that reason, a large-size chiller unit is needed in the related art. Therefore, in some cases, the chiller unit should be disposed on a floor differing from the floor on which a plasma processing apparatus is disposed. In contrast, in the stage ST described above, the first flow paths 26 and the second flow paths 28 are high in conductance. It is therefore possible to reduce the size of a pump of the chiller unit 42. Thus, as shown in FIG. 16, the chiller unit 42 can be installed on the same floor as the floor on which the plasma processing apparatus 50 is installed. This makes it possible to shorten the length of the first pipeline 40a and the second pipeline 40b which interconnect the stage ST and the chiller unit 42. As a result, it is possible to shorten the time required for the heat exchange medium to flow from the chiller unit 42 to the stage ST. Thus, temperature control can be performed with high responsiveness. It is also possible to suppress dissipation of the heat of the heat exchange medium when the heat exchange medium passes through the first pipeline 40a and the second pipeline 40b.

While some embodiments have been described above, the present disclosure is not limited to the above-described embodiments but may be modified in many different forms. For example, the cell portions C formed by the partition wall 20 is not limited to a substantially hexagonal columnar shape but may have a circular columnar shape or a substantially polygonal shape.

In the above-described embodiments, the heat exchanger 6 and the flow path unit 8 are formed independently of each other. However, the heat exchanger 6 and the flow path unit 8 may be combined to form one-piece. In this case, the flow path unit 8, which may be hard to plot, may be plotted by the aforementioned method using computer tomography (CT). A model data may be obtained by combining the plotted flow path unit 8 with the heat exchanger 6 plotted separately. In the above-described embodiments, the heat exchanger 6 is accommodated within the case 4. Alternatively, the heat exchanger 6 may be installed above the case 4. In this case, the heat exchanger 6 is made of a metal.

In the above-described embodiments, the description has been made on the configuration in which the flow paths are formed independently of one another. However, the present disclosure is not limited thereto. Specifically, the flow paths adjoining each other may communicate with each other. Further, cavities may exist between the flow paths. The inside of the case 4 may be filled with the heat exchange medium. This configuration provides flow paths which are similar to the organization of the animals and plants. This configuration may be formed by a low-precision 3D printer. Further, even if one flow path does not work, the heat exchange medium is supplied from another flow path communicating with the one flow path that does not work. Consequently, it is possible to improve a throughput and reduce a failure rate during the formation of the flow path unit 8.

The substrate processing apparatus which makes use of the stage ST is not limited to the plasma processing apparatus. The stage ST may be used in any arbitrary processing apparatus as long as the processing apparatus can process a substrate while controlling the temperature of the substrate. For example, the stage ST may be used in a semiconductor manufacturing apparatus such as a coating/developing apparatus, a cleaning apparatus, a film forming apparatus, an etching apparatus, an ashing apparatus, and a heat treatment apparatus, or a flat panel display manufacturing apparatus.

In the above-described embodiments, the description has been made mainly on the uniform control of the temperature distribution of the substrate. However, the present disclosure is not limited thereto. For example, a non-uniform plasma distribution may be cancelled by intentionally making the substrate temperature distribution non-uniform. In this case, the non-uniform substrate temperature distribution can be realized by adjusting the conductance of the flow paths, adjusting the arrangement or shape of the heaters, controlling the temperature of the heaters, or independently supplying the heat exchange media to the respective flow paths.

This makes it possible to process the substrate with increased in-plane uniformity.

Figure 17:
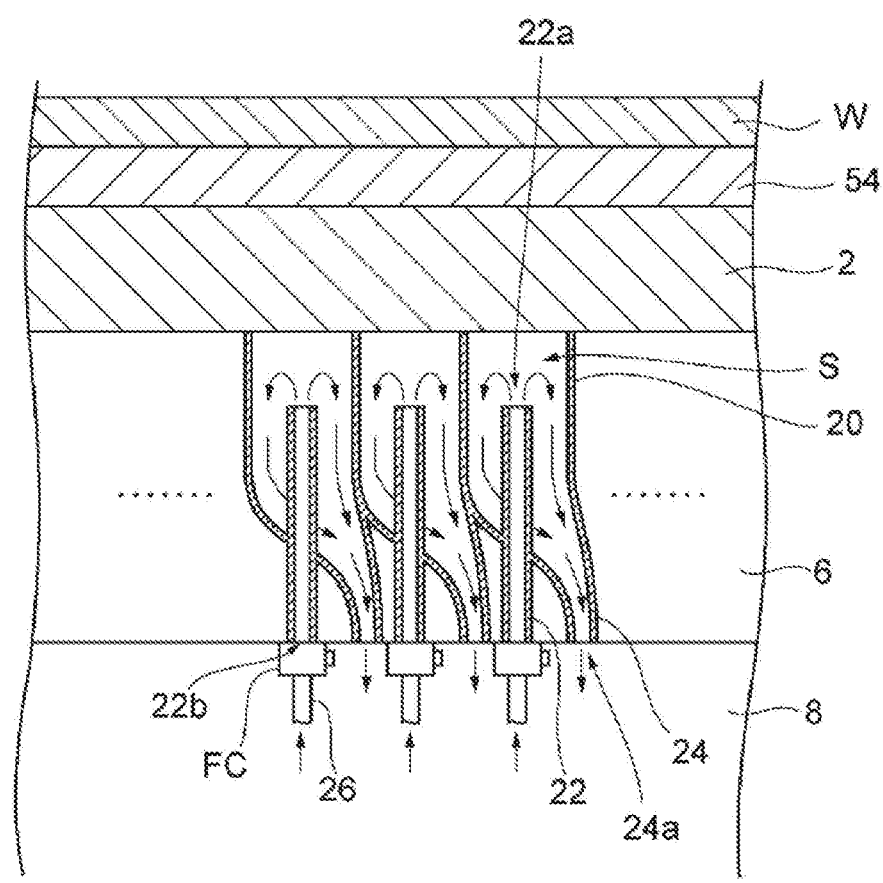
FIG. 17 is a sectional view schematically showing the flow of the heat exchange medium within the heat exchanger.

In some embodiments, as shown in FIG. 17, a plurality of flow rate controllers FC may be respectively connected to the first pipes 22. The flow rate controllers FC may be installed between the first end portions 26a of the first flow paths 26 and the first pipes 22, respectively. The flow rate controllers FC may be, e.g., needle valves or orifices. The flow rate controllers FC control the flow rates of the heat exchange media introduced into the respective first pipes 22. The flow rate controllers FC are configured to individually adjust the opening degrees of valves thereof.

In a stage of some embodiments, the valves of the flow rate controllers FC may be set at different opening degrees depending on the arrangement positions thereof. For example, when the plate 2 is divided into a plurality of zones along a radial direction, the opening degrees of the valves of the flow rate controllers FC may differ in each of the flow rate controllers FC connected to the respective first pipes 22 which face the respective zones of the plate 2. With this configuration, the flow rate of the heat exchange medium discharged to the radially divided zones of the plate 2 can be changed on a zone-by-zone basis. Since the heat exchange rate is changed on a zone-by-zone basis, it is possible to enable the plate 2 to have a temperature distribution in which a temperature varies in a radial direction.

The heat exchanger is not limited to the one having the illustrated configuration but may have an arbitrary configuration as long as the heat exchanger is configured to supply a heat exchange medium to a plurality of two-dimensionally distributed and mutually non-inclusive regions and to recover the heat exchange medium thus supplied. In addition, the embodiments described above may be combined unless a conflict arises.

As described above, according to different aspects and embodiments of the present disclosure, it is possible to provide a stage, a stage manufacturing method and a heat exchanger which are capable of improving the accuracy of temperature control.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage manufacturing method, comprising:
preparing a plate having a front surface, on which a substrate is mounted, and a rear surface, and preparing a case;
preparing a heat exchanger and a flow path unit either individually or simultaneously; and
manufacturing a stage which includes the plate, the case, the heat exchanger and the flow path unit,
wherein the heat exchanger includes:
a plurality of first pipes extending upward toward the rear surface of the plate, each of the plurality of the first pipes providing a first open end portion facing the rear surface of the plate and a second open end portion positioned at an opposite side from the first open end portion, the plurality of first pipes distributed below the plate;
a plurality of partition walls configured to define a plurality of spaces surrounding the first pipes, respectively; and
a plurality of second pipes connected to the plurality of partition walls so as to respectively communicate with the plurality of spaces, and each of the second pipes providing a third open end portion for discharging the heat exchange medium,
wherein the flow path unit includes:
a plurality of first flow paths having first end portions and second end portions, the first end portions of the first flow paths respectively connected to the first pipes; and
a plurality of second flow paths having first end portions and second end portions, the first end portions of the second flow paths respectively connected to the second pipes,
wherein the case is configured to support the plate and to define, together with the plate, an accommodation space which accommodates the heat exchanger and the flow path unit,
wherein the flow path unit is a solid body as a whole having a top surface, a side surface and a bottom surface, and the first flow paths and the second flow paths are formed as cavities within the solid body,
wherein each of the first end portions of the plurality of first flow paths is opened on the top surface in a position coinciding with one corresponding second open end portion of the plurality of first pipes, when viewed in plan view, and each of the first end portions of the plurality of second flow paths is opened on the top surface in a position coinciding with one corresponding third open end portion of the plurality of second pipes, when viewed in plan view,
wherein the flow path unit includes:
a first cluster portion in which the second end portions of the first flow paths are locally collected; and
a second cluster portion in which the second end portions of the second flow paths are locally collected,
wherein, in the first cluster portion and the second cluster portion, each of the first flow paths and the second flow paths is maintained as an independent flow path,
wherein the case includes a first opening which faces the first cluster portion of the flow path unit and a second opening which faces the second cluster portion of the flow path unit, and
wherein at least the flow path unit is formed using a 3D printer.

2. The method of claim 1, wherein the preparing the heat exchanger and the flow path unit either individually or simultaneously includes:
preparing an inversion model which includes a plurality of solid cables having inverted shapes of the plurality of first flow paths and the plurality of second flow paths, and a plurality of isolating tubes respectively covering the plurality of solid cables to keep the plurality of solid cables from contacting each other and made of a material different from a material of the plurality of solid cables;
generating model data for the 3D printer based on an inversion pattern of three-dimensional data of the plurality of solid cables, the three-dimensional data being generated from a CT image based on a difference in material between the plurality of solid cables and the plurality of isolating tubes, the CT image being obtained by imaging the inversion model by computer tomography; and forming the flow path unit using the 3D printer and the model data.

3. The method of claim 2, wherein the inversion model further includes a bundling tube bundling end portions of the plurality of solid cables.

4. The method of claim 2, wherein the preparing the heat exchanger and the flow path unit either individually or simultaneously further includes adjusting the model data such that a diameter, a curvature and a length of the plurality of first flow paths and the plurality of second flow paths are adjusted.

5. The method of claim 1, wherein each of the first flow paths has a diameter determined to make the first flow paths equal in conductance to one another and each of the second flow paths has a diameter determined to make the second flow paths equal in conductance to one another.

6. The method of claim 1, wherein the case includes a cylindrical sidewall which supports the plate, the sidewall including a stepped portion formed by reducing a diameter of a portion of an outer circumferential surface of the sidewall, and further comprising:

a plurality of balls disposed along the stepped portion and made of a heat insulating material.

7. The method of claim 1, wherein a plurality of recess portions into which the open end portions of the first pipes are respectively inserted is formed on the rear surface of the plate.

8. The method of claim 1, wherein a spirally-extending slope is formed on an outer circumferential surface of each of the first pipes.

9. The method of claim 1, wherein a plurality of heaters disposed so as to be two-dimensionally distributed is installed within the plate.

10. The method of claim 1, wherein an electrostatic chuck configured to electrostatically suck the substrate is installed on the front surface of the plate.

11. The method of claim 1, wherein a plurality of flow rate controllers configured to control flow rates of the heat exchange medium introduced into the first pipes corresponding to the flow rate controllers is respectively connected to the first pipes.

12. The method of claim 11, wherein the flow rate controllers are needle valves or orifices, and when the plate is divided into a plurality of zones along a radial direction, opening degrees of valves of the flow rate controllers differ in each of the flow rate controllers connected to the first pipes which face the respective zones.

13. The method of claim 1, wherein the plurality of first pipes, the plurality of partition walls, and the plurality of second pipes are combined to form one-piece by a resin.

14. The method of claim 1, wherein the heat exchanger and the flow path unit are combined to form one-piece by a resin.

* * * * *